(12) United States Patent
Cho et al.

(10) Patent No.: US 12,632,130 B2
(45) Date of Patent: May 19, 2026

(54) ELECTRONIC PEN INCLUDING CORE STRUCTURE, AND ELECTRONIC DEVICE INCLUDING SAME

(71) Applicant: Samsung Electronics Co., Ltd., Suwon-si (KR)

(72) Inventors: Gyuyeong Cho, Suwon-si (KR); Jaedeok Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/045,989

(22) Filed: Feb. 5, 2025

(65) Prior Publication Data

US 2025/0181178 A1 Jun. 5, 2025

Related U.S. Application Data

(63) Continuation of application No. PCT/KR2023/008641, filed on Jun. 21, 2023.

(30) Foreign Application Priority Data

Aug. 10, 2022 (KR) ........................ 10-2022-0099918
Aug. 18, 2022 (KR) ........................ 10-2022-0103246

(51) Int. Cl.
G06F 3/0354 (2013.01)
G06F 3/046 (2006.01)
H05K 5/02 (2006.01)
(52) U.S. Cl.
CPC .......... G06F 3/03545 (2013.01); G06F 3/046 (2013.01); H05K 5/0217 (2013.01)

(58) Field of Classification Search
CPC .... G06F 3/03545; G06F 3/046; H05K 5/0217
See application file for complete search history.

(56) References Cited

U.S. PATENT DOCUMENTS 8,487,733 B2 7/2013 Chu et al.
10,095,354 B2 10/2018 Ahn
(Continued)

FOREIGN PATENT DOCUMENTS

KR 10-1459535 B1 11/2014
KR 10-1548276 B1 8/2015
(Continued)

OTHER PUBLICATIONS

Hwang et al., KR 20220013128 A machine translation (Year: 2020).*
(Continued)

*Primary Examiner* — Peter D McLoone
(74) *Attorney, Agent, or Firm* — Jefferson IP Law, LLP

(57) ABSTRACT

An electronic device is provided. The electronic device includes a housing and an electronic pen detachable from the housing, wherein the electronic pen includes a case, a pen tip disposed at one end of the case and protruded from the one end to an outside of the case, a rod extending from the pen tip into an inside of the case, a core including a first portion facing the one end of the case and including a first material, a second portion contacting the first portion and including a second material, and a through-hole penetrating the first and second portions and accommodating at least a portion of the rod, and a conductive coil surrounding at least a portion of the second portion, wherein a magnetic flux density of the first material is greater than a magnetic flux density of the second material.

20 Claims, 8 Drawing Sheets

(56)     References Cited

U.S. PATENT DOCUMENTS

| | | | |
|---|---|---|---|
| 10,234,962 | B2 | 3/2019 | Obata |
| 10,345,930 | B2 | 7/2019 | Horie et al. |
| 10,459,539 | B2 * | 10/2019 | Kamiyama ............. G06F 3/046 |
| 10,937,581 | B2 | 3/2021 | Kim et al. |
| 11,662,837 | B2 | 5/2023 | Kim et al. |
| 11,714,451 | B2 | 8/2023 | Lee et al. |
| 2018/0088690 | A1 | 3/2018 | Seo et al. |
| 2019/0278349 | A1 | 9/2019 | Marshall et al. |
| 2019/0384402 | A1 | 12/2019 | Huizar et al. |
| 2022/0100290 | A1 | 3/2022 | Lehmann et al. |
| 2022/0137731 | A1 | 5/2022 | Matsumoto |

FOREIGN PATENT DOCUMENTS

| | | | |
|---|---|---|---|
| KR | 10-1707899 | B1 | 2/2017 |
| KR | 10-2017-0117816 | A | 10/2017 |
| KR | 10-2018-0035606 | A | 4/2018 |
| KR | 10-2020-0126422 | A | 11/2020 |
| KR | 10-2217286 | B1 | 2/2021 |
| KR | 10-2275511 | B1 | 7/2021 |
| KR | 10-2022-0013128 | A | 2/2022 |

OTHER PUBLICATIONS

International Search Report with Written Opinion and English translation dated Oct. 10, 2023; International Appln. No. PCT/KR2023/008641.

* cited by examiner

FIG. 4

ELECTRONIC PEN INCLUDING CORE STRUCTURE, AND ELECTRONIC DEVICE INCLUDING SAME

CROSS-REFERENCE TO RELATED APPLICATION(S)

This application is a continuation application, claiming priority under 35 U.S.C. § 365(c), of an International application No. PCT/KR2023/008641, filed on Jun. 21, 2023, which is based on and claims the benefit of a Korean patent application number 10-2022-0099918, filed on Aug. 10, 2022, in the Korean Intellectual Property Office, and of a Korean patent application number 10-2022-0103246, filed on Aug. 18, 2022, in the Korean Intellectual Property Office, the disclosure of each of which is incorporated by reference herein in its entirety.

BACKGROUND

1. Field

The disclosure relates to an electronic pen including a core structure, and an electronic device including the same.

2. Description of Related Art

An electronic device such as a smart phone, a tablet personal computer (PC), and a notebook computer may include a stylus pen linked with the electronic device. By inputting a signal designated by a user to a display of the electronic device, the stylus pen may provide a various user experience to the user.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic pen including core structure, and electronic device including same.

Additional aspects will be set forth in part in the description which follows and, in part, will be apparent from the description, or may be learned by practice of the presented embodiments.

In accordance with an aspect of the disclosure, an electronic device is provided. The electronic device includes a housing, an electronic pen detachable from the housing, wherein the electronic pen includes a case, a pen tip disposed at one end of the case and protruded from the one end to an outside of the case, a rod extending from the pen tip into an inside of the case, and a core including a first portion facing the one end of the case and including a first material, a second portion contacting the first portion and including a second material, and a through hole penetrating the first and second portions and accommodating at least a portion of the rod, and a conductive coil surrounding at least a portion of the second portion, wherein a magnetic flux density of the first material is greater than a magnetic flux density of the second material.

In accordance with another aspect of the disclosure, an electronic pen is provided. The electronic pen includes a case, a pen tip disposed at one end of the case and protruded from the one end to an outside of the case, a rod extending from the pen tip into an inside of the case, and a core including a first portion facing the one end of the case and including a first material, a second portion contacting the first portion and including a second material, and a through hole penetrating the first and second portions and accommodating at least a portion of the rod, and a conductive coil surrounding at least a portion of the second portion, wherein a magnetic flux density of the first material is greater than a magnetic flux density of the second material.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4 illustrates an operation of an electronic pen according to an embodiment of the disclosure;

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display driver integrated circuit (IC), an audio CODEC chip, a universal serial bus (USB) controller, a camera controller, an image processing IC, a microprocessor unit (MPU), a system on chip (SoC), an IC, or the like.

Figure 1:
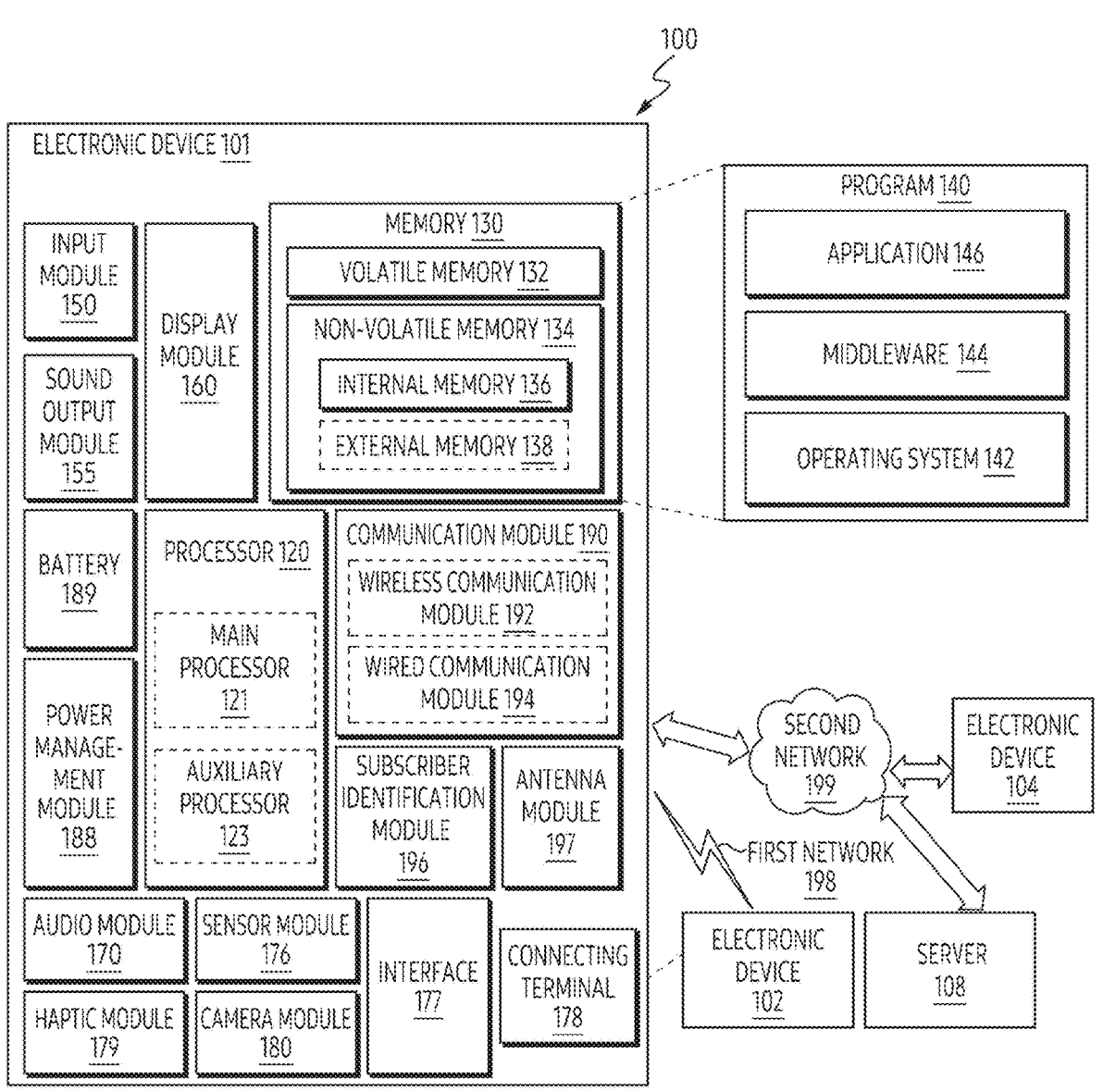
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to another embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to yet another embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to yet another embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to yet another embodiment, the auxiliary processor 123 (e.g., an image signal processor or a communication processor) may be implemented as part of another component (e.g., the camera module 180 or the communication module 190) functionally related to the auxiliary processor 123. According to yet another embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to yet another embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to yet another embodiment, the display module 160 may include a touch sensor adapted to detect a touch, or a pressure sensor adapted to measure the intensity of force incurred by the touch.

The audio module 170 may convert a sound into an electrical signal and vice versa. According to yet another embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to yet another embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to yet another embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to yet another embodiment, the connecting terminal 178 may include, for example, an HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to yet another embodiment, the haptic module 179 may include, for example, a motor, a piezoelectric element, or an electric stimulator.

The camera module 180 may capture a still image or moving images. According to yet another embodiment, the camera module 180 may include one or more lenses, image sensors, image signal processors, or flashes.

The power management module 188 may manage power supplied to the electronic device 101. According to yet another embodiment, the power management module 188 may be implemented as at least part of, for example, a power management integrated circuit (PMIC).

The battery 189 may supply power to at least one component of the electronic device 101. According to yet another embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to yet another embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to yet another embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to yet another embodiment, the antenna module 197 may include an antenna including a radiating element composed of a conductive material or a conductive pattern formed in or on a substrate (e.g., a printed circuit board (PCB)). According to yet another embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to yet another embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to yet another embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to yet another embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to yet another embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
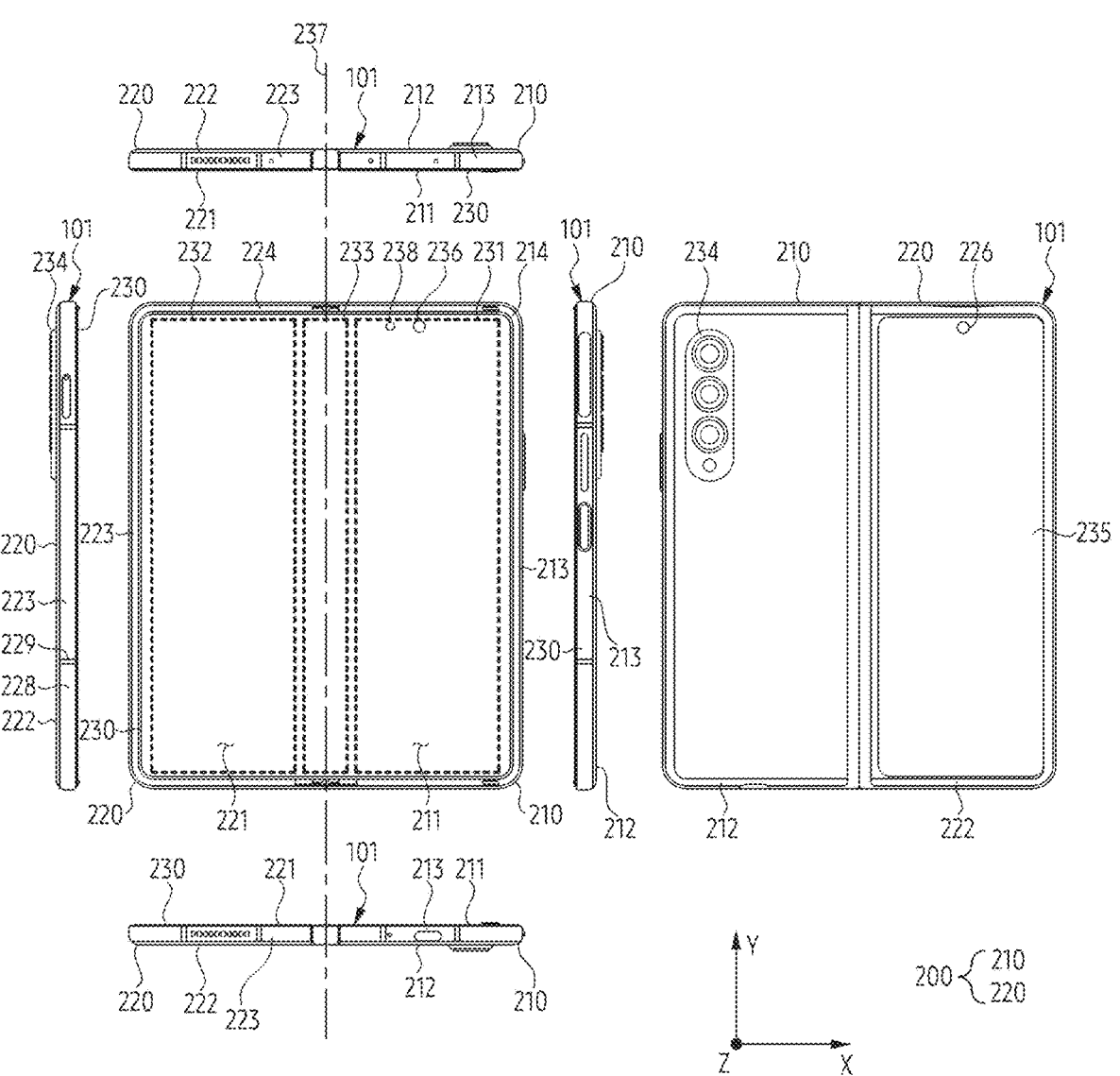
FIG. 2A illustrates an example of an unfolded state of an electronic device according to an embodiment of the disclosure.

FIG. 2A illustrates an example of an unfolded state of an electronic device according to an embodiment of the disclosure.

Figure 2B:
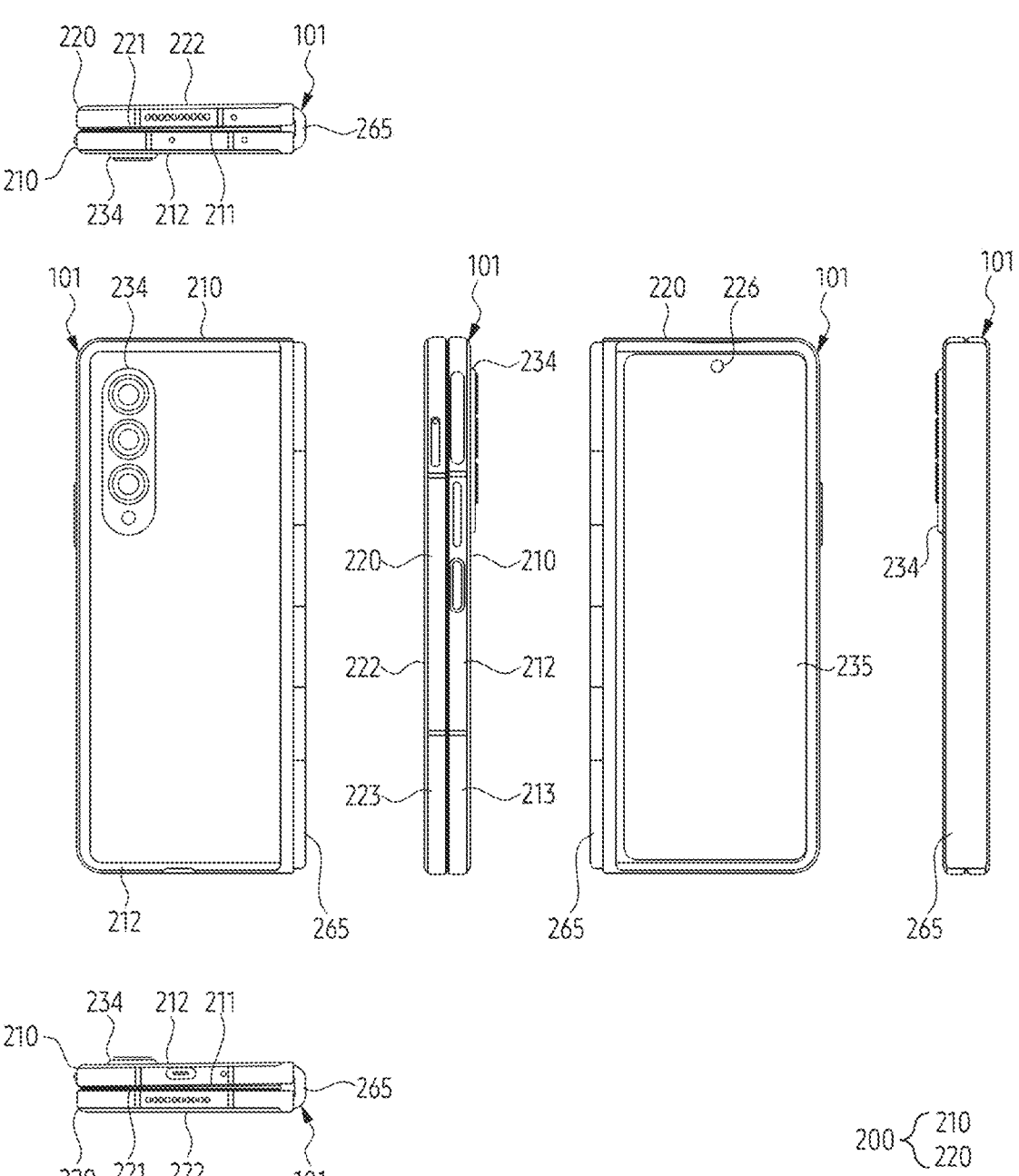
FIG. 2B illustrates an example of a folded state of an electronic device according to an embodiment of the disclosure.

FIG. 2B illustrates an example of a folded state of an electronic device according to an embodiment of the disclosure.

Figure 2C:
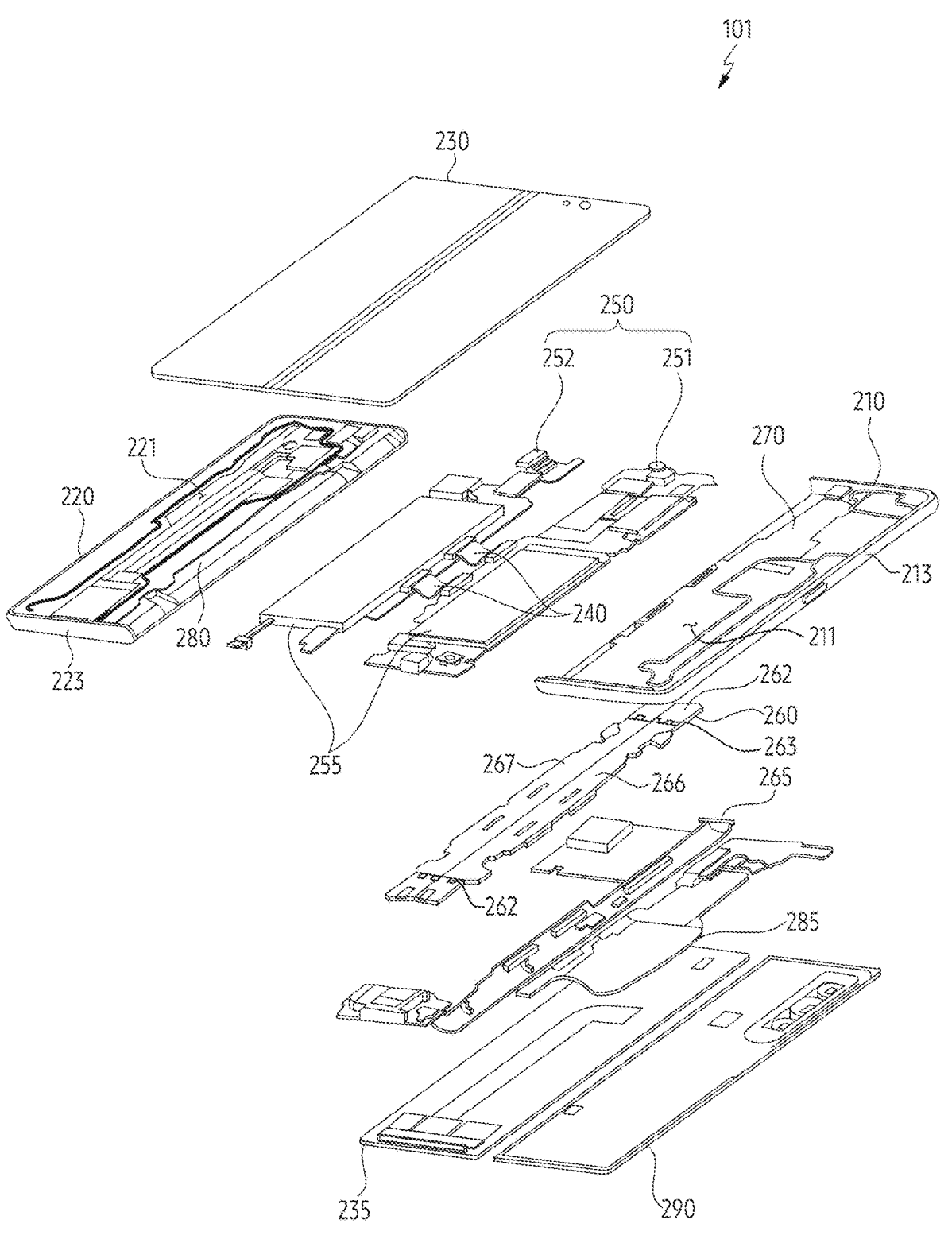
FIG. 2C is an exploded view of an electronic device according to an embodiment of the disclosure.

FIG. 2C is an exploded view of an electronic device according to an embodiment of the disclosure.

Referring to FIGS. 2A, 2B, and 2C, the electronic device 101 may include a housing 200 and a flexible display panel 230. The housing 200 may include a first housing 210 and a second housing 220.

According to an embodiment, the first housing 210 may include a first surface 211, a second surface 212 faced away from the first surface 211, and a first lateral side 213 surrounding at least a portion of the first surface 211 and the second surface 212. According to another embodiment, the second surface 212 may further include at least one camera 234 exposed through a portion of the second surface 212. According to yet another embodiment, the first housing 210 may include a first protection member 214 disposed along a periphery of the first surface 211. According to yet another embodiment, the first housing 210 may provide a space formed by the first surface 211, the second surface 212, and the first lateral side 213 as a space for mounting components of the electronic device 101. According to yet another embodiment, the first lateral side 213 and a second lateral side 223 may include a conductive material, a non-conductive material, or a combination thereof. For example, the second lateral side 223 may include a conductive member 228 and a non-conductive member 229. The conductive member 228 may include a plurality of conductive members and the plurality of conductive members may be spaced apart from each other. The non-conductive member 229 may be disposed between the plurality of conductive members. An antenna structure may be formed by a portion of the plurality of conductive members and the plurality of non-conductive members, or a combination thereof.

According to yet another embodiment, the second housing 220 may include a third surface 221, a fourth surface 222 faced away from the third surface 221, and the second lateral side 223 surrounding at least a portion of the third surface 221 and the fourth surface 222. According to yet another embodiment, the fourth surface 222 may further include a display panel 235 disposed on the fourth surface 222. A camera 226 may be disposed to face the fourth surface 222 inside the second housing 220 to obtain an external image through the fourth surface 222. The camera 226 may be covered by the display panel 235, by being disposed under the display panel 235. According to yet another embodiment, the camera 226 may be disposed under the display panel 235, and the display panel 235 may include an opening that transmits light from an outside to the camera 226 by being aligned with lens of the camera 226. According to yet another embodiment, each of the first housing 210 and the second housing 220 may include each of the first protection member 214 and a second protection member 224. The first protection member 214 and the second protection member 224 may be disposed on the first surface 211 and the third surface 221 along a periphery of the flexible display panel 230. The first protection member 214 and the second protection member 224 may prevent a foreign substance (e.g., dust or moisture) from introducing through a gap between the flexible display panel 230 and the first housing 210 and the second housing 220. The first protection member 214 may be disposed along a periphery of a first display region 231, and the second protection member 224 may be disposed along a periphery of a second display region 232. The first protection member 214 may be formed by being attached to the first lateral side 213 of the first housing 210, or may be integrally formed with the first lateral side 213. The second protection member 224 may be formed by being attached to the second lateral side 223 of the second housing 220, or may be integrally formed with the second lateral side 223.

According to yet another embodiment, the second lateral side 223 may be rotatably (or pivotably) connected to the first lateral side 213 through a hinge structure 260 mounted on a hinge cover 265. The hinge structure 260 may include a hinge module 262, a first hinge plate 266, and a second hinge plate 267. The first hinge plate 266 may be connected to the first housing 210, and the second hinge plate 267 may be connected to the second housing 220. According to yet another embodiment, the second housing 220 may provide a space formed by the third surface 221, the fourth surface 222 faced away from the third surface 221, and the second lateral side 223 surrounding at least a portion of the third surface 221 and the fourth surface 222 as a space for mounting the components of the electronic device 101. According to yet another embodiment, the flexible display panel 230 may include a window exposed toward the outside. The window may protect a surface of the flexible display panel 230, and may transmit visual information provided from the flexible display panel 230 to the outside, by being formed of a transparent member. The window may include a glass material such as an ultra-thin glass (UTG) or a polymer material such as polyimide (PI). According to yet another embodiment, the flexible display panel 230 may be disposed on the first surface 211 of the first housing 210 and the third surface 221 of the second housing 220 across the hinge cover 265. The flexible display panel 230 may include the first display region 231 disposed on the first surface 211 of the first housing 210, the second display region 232 disposed on the third surface 221 of the second housing 220, and a third display region 233 between the first display region 231 and the second display region 232. The first display region 231, the second display region 232, and the third display region 233 may form a front side of the flexible display panel 230.

According to yet another embodiment, the opening may be formed in a portion of a screen display region of the flexible display panel 230, or a recess or the opening may be formed in a support member (e.g., bracket) supporting the flexible display panel 230. The electronic device 101 may include at least one or more of a sensor module 238 aligned with the recess or the opening, and a camera 236. For example, the first display region 231 may further include the camera 236 capable of obtaining an image from the outside through the portion of the first display region 231 and the sensor module 238 generating an electrical signal or a data value corresponding to an external environmental condition. According to yet another embodiment, at least one or more of the sensor module 238 and the camera 236 may be included on a rear side of the flexible display panel 230 corresponding to the first display region 231 or the second display region 232 of the flexible display panel 230. For example, at least one of the camera 236 and the sensor module 238 may be disposed under the flexible display panel 230 and surrounded by the flexible display panel 230. At least one of the camera 236 and the sensor module 238 may not be exposed to the outside by being surrounded by the flexible display panel 230. However, it is not limited thereto, and the flexible display panel 230 may include the opening exposing the camera 236 and the sensor module 238 to the outside. Although not illustrated in FIGS. 2A and 2B, according to yet another embodiment, the flexible display panel 230 may further include the rear side opposite to the front side. According to yet another embodiment, the flexible display panel 230 may be supported by a first support member 270 of the first housing 210 and a second support member 280 of the second housing 220.

According to yet another embodiment, the hinge structure 260 may be configured to rotatably couple to the first support member 270 that forms the first housing 210 and is fastened to the first hinge plate 266, and the second support member 280 that forms the second housing 220 and is fastened to the second hinge plate 267.

According to yet another embodiment, the hinge cover 265 surrounding the hinge structure 260 may be at least partially exposed through a space between the first housing 210 and the second housing 220 while the electronic device 101 is in a folded state. In another embodiment, the hinge cover 265 may be covered by the first housing 210 and the second housing 220 while the electronic device 101 is in an unfolded state.

According to yet another embodiment, the electronic device 101 may be folded with respect to a folding axis 237 passing through the hinge cover 265. For example, the hinge cover 265 may be disposed between the first housing 210 and the second housing 220 of the electronic device 101 so that the electronic device 101 may be bent, curved, or folded. For example, the first housing 210 may be connected to the second housing 220 through the hinge structure 260 mounted on the hinge cover 265 and may rotate with respect to the folding axis 237. For example, the hinge structure 260 may include the hinge modules 262 disposed at both ends of the first hinge plate 266 and the second hinge plate 267. Since the hinge module 262 includes hinge gears engaged with each other therein, the hinge module 262 may rotate the first hinge plate 266 and the second hinge plate 267 with respect to the folding axis. The first housing 210 coupled to the first hinge plate 266 may be connected to the second housing 220 coupled to the second hinge plate 267, and may rotate with respect to the folding axis by hinge modules 262.

According to yet another embodiment, the electronic device 101 may be folded so that the first housing 210 and the second housing 220 face each other by rotating with respect to the folding axis 237. According to yet another embodiment, the electronic device 101 may be folded so that the first housing 210 and the second housing 220 are folded or overlap each other.

Referring to FIG. 2C, the electronic device 101 may include the first support member 270, the second support member 280, the hinge structure 260, the flexible display panel 230, a printed circuit board 250, a battery 255, the hinge cover 265, an antenna 285, the display panel 235, and a rear plate 290. According to yet another embodiment, the electronic device 101 may omit at least one of the components or may additionally include another component. At least one of the components of the electronic device 101 may be the same as or similar to at least one of the components of the electronic device 101 of FIG. 1, 2A, or 2B, and a redundant description will be omitted below.

The hinge structure 260 may include the hinge module 262, the first hinge plate 266, and the second hinge plate 267. The hinge module 262 may include a hinge gear 263 that enables the first hinge plate 266 and the second hinge plate 267 to be pivotable. The hinge gear 263 may rotate the first hinge plate 266 and the second hinge plate 267 while engaging with each other and rotating. The hinge module 262 may be a plurality of hinge modules. Each of the plurality of hinge modules may be disposed at both ends formed by the first hinge plate 266 and the second hinge plate 267.

The first hinge plate 266 may be coupled to the first support member 270 of the first housing 210, and the second hinge plate 267 may be coupled to the second support member 280 of the second housing 220. The first housing 210 and the second housing 220 may rotate to correspond to rotation of the first hinge plate 266 and the second hinge plate 267.

The first housing 210 may include the first support member 270, and the second support member 280. The first support member 270 may be partially surrounded by the first lateral side 213, and the second support member 280 may be partially surrounded by the second lateral side 223. The first support member 270 may be integrally formed with the first lateral side 213, and the second support member 280 may be integrally formed with the second lateral side 223. According to yet another embodiment, the first support member 270 may be formed separately from the first lateral side 213, and the second support member 280 may be formed separately from the second lateral side 223. The first lateral side 213 and the second lateral side 223 may be used as an antenna formed by a metal material, a non-metal material, or a combination thereof.

The first support member 270 may be coupled to the flexible display panel 230 on a surface, and may be coupled to the rear plate 290 on another surface. The second support member 280 may be coupled to the flexible display panel 230 on a surface, and may be coupled to the display panel 235 on another surface.

The printed circuit board 250 and the battery 255 may be disposed between a surface formed by the first support member 270 and the second support member 280 and a surface formed by the display panel 235 and the rear plate 290. The printed circuit board 250 may be separated in order to be disposed in each of the first support member 270 of the first housing 210 and the second support member 280 of the second housing 220. Shapes of the first printed circuit board 251 disposed in the first support member 270 and the second printed circuit board 252 disposed in the second support member 280 may be different from each other according to a space of an inside of the electronic device. Components for implementing various functions of the electronic device 101 may be mounted on the first printed circuit board 251 and the second printed circuit board 252. According to yet another embodiment, components for implementing an overall function of the electronic device 101 may be mounted on the first printed circuit board 251, and electronic components for implementing a portion of function of the first printed circuit board 251 may be disposed or components for driving the display panel 235 disposed on the fourth surface 222 may be disposed, on the second printed circuit board 252. The first printed circuit board 251 and the second printed circuit board 252 may be electrically connected to each other by a flexible printed circuit board 240.

For example, the battery 255, which is a device for supplying power to at least one component of the electronic device 101, may include, for example, a non-rechargeable primary battery, or a rechargeable secondary battery, or a fuel cell. At least a portion of the battery 255 may be disposed on substantially the same plane as the printed circuit board 250. The surface of the printed circuit board 250 and the battery 255 formed as substantially the same plane may be disposed on a surface (e.g., a surface facing the second surface 212 and the fourth surface 222 or a surface facing the display panel 235 and the rear plate 290) of the first support member 270 and the second support member 280. For example, the flexible display panel 230 may be disposed on the first surface 211 and the third surface 221, and the printed circuit board 250 and the battery 255 may be disposed on the second surface 212 and the fourth surface 222 facing a surface on which the flexible display panel 230 is disposed.

In yet another embodiment, the antenna 285 may be disposed between the rear plate 290 and the battery 255. For example, the antenna 285 may include a near field communication (NFC) antenna, a wireless charging antenna, and/or a magnetic secure transmission (MST) antenna. For example, the antenna 285 may perform short-range communication with an external device, or wirelessly transmit and receive power required for charging.

Figure 3:
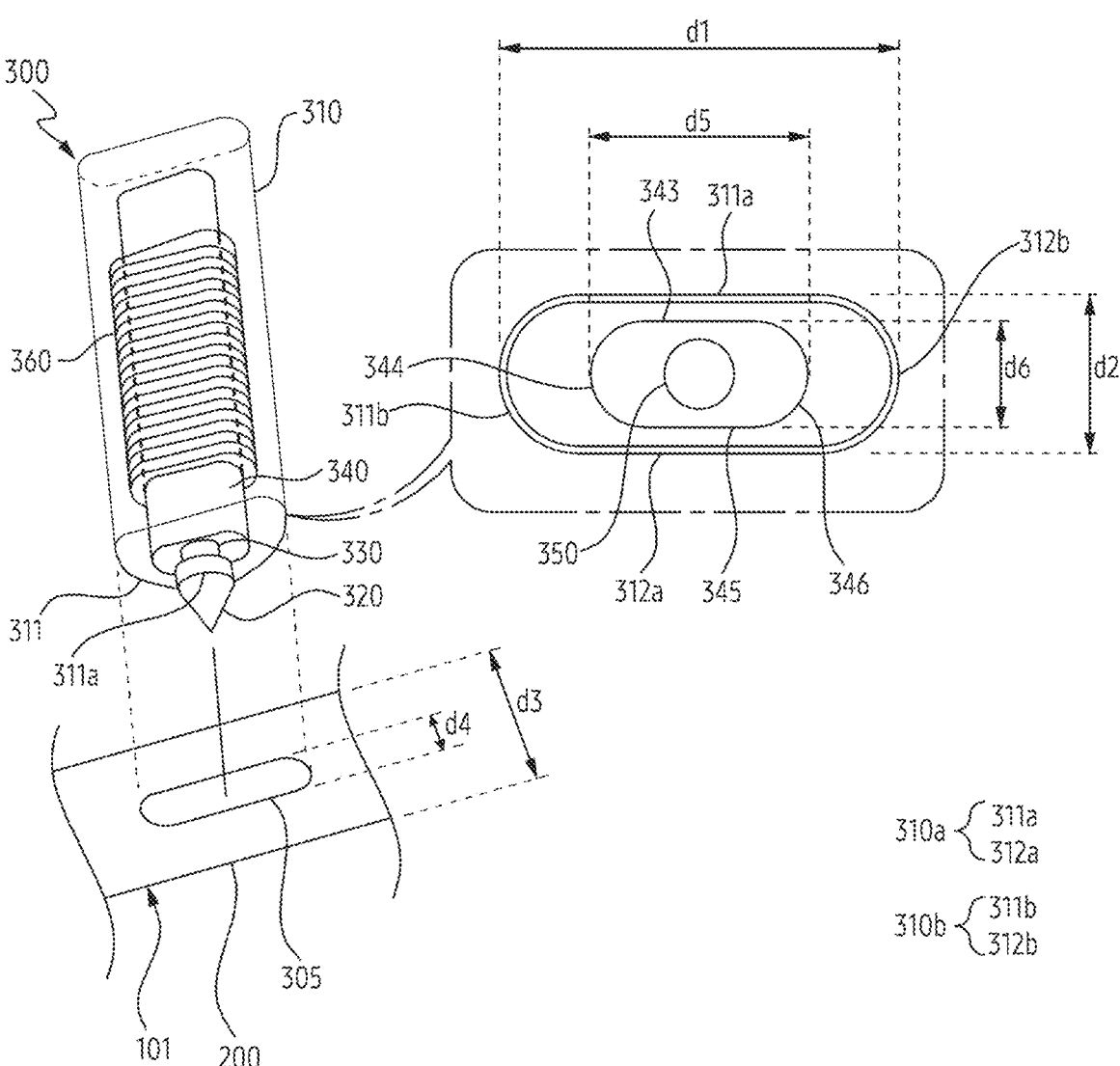
FIG. 3 illustrates an electronic pen detachable from a housing according to an embodiment of the disclosure.

FIG. 3 illustrates an electronic pen detachable from a housing according to an embodiment of the disclosure.

Referring to FIG. 3, the electronic device 101 may include a housing 200, and an electronic pen 300. The electronic pen may include a case 310, a pen tip 320, a rod 330, a core 340, and a conductive coil 360.

According to an embodiment, the housing 200 may include an accommodating hole 305 for accommodating the electronic pen 300. The accommodating hole 305 may be disposed on a portion of a lateral side (e.g., the first lateral side 213 and the second lateral side 223 of FIG. 2A) of the housing 200. The accommodating hole 305 may extend from the portion of the lateral side 213 and 223 toward the inside of the electronic device 101. For example, a length of the accommodating hole 305 extending in an internal direction of the electronic device 101 may correspond to a length of the electronic pen 300. An inner circumference surface of the accommodating hole 305 may correspond to a shape of the electronic pen 300. The housing 200 may provide an accommodating space for the electronic pen 300 to the electronic device 101 by including the accommodating hole 305.

According to another embodiment, the electronic pen 300 may be detachable from the housing 200 of the electronic device 101. For example, the electronic pen 300 may be inserted into the accommodating hole 305 of the electronic device 101 and fixed in the electronic device 101. The electronic pen 300 may be separated from the electronic device 101 by being detached from the accommodating hole 305.

According to yet another embodiment, the case 310 may configure at least a portion of an exterior of the electronic pen 300. The case 310 may provide a space for internal components of the electronic pen 300. The case 310 may face the inner circumference surface of the accommodating hole 305 in a state in which the electronic pen 300 is inserted into the accommodating hole 305. The case 310 may reduce damage to the internal components of the electronic pen 300 due to an external impact.

According to yet another embodiment, the case 310 may include a flat region 310a extending in a longitudinal direction of the electronic pen 300 and a curved region 310*b* extending from the flat region 310*a*. The flat region 310*a* and the curved region 310*b* may surround the inside of the electronic pen 300. For example, the flat region 310*a* may include a first flat region 311*a* and a second flat region 312*a* parallel to each other. The internal components of the electronic pen 300 may be disposed between the first flat region 311*a* and the second flat region 312*a*. The curved region 310*b* may include a first curved region 311*b* extending from one periphery of the first flat region 311*a* to one periphery of the second flat region 312*a*, and a second curved region 312*b* facing the first curved region 311*b* and extending from another periphery of the first flat region 311*a* to another periphery of the second flat region 312*a*. The flat regions 311*a* and 312*a* and the curved regions 311*b* and 312*b* may surround an internal space in which the internal components of the electronic pen 300 are disposed.

According to yet another embodiment, one cross section of the case 310 may have a track shape of which a length d1 of a major axis is longer than a length d2 of a minor axis. For example, the one cross section of the case 310 may correspond to a shape of one cross section of the flat regions 311*a* and 312*a* parallel to each other extending in the longitudinal direction of the electronic pen 300 and the curved regions 311*b* and 312*b* extending from the flat regions 311*a* and 312*a* and facing each other. As the curved regions 311*b* and 312*b* have a designated radius of curvature, the one cross section of the case 310 may have the track shape. The length d1 of the track-shaped major axis may correspond to the longest distance between the curved regions 311*b* and 312*b*. The length d2 of the track-shaped minor axis may correspond to a vertical distance between the flat regions 311*a* and 312*a*.

According to yet another embodiment, the length d2 of the minor axis of the one cross section of the case 310 may be smaller than a length d3 corresponding to a thickness of the lateral side 213 and 223 of the housing 200. For example, the lateral side 213 and 223 of the housing 200 may include the accommodating hole 305 having a shape corresponding to the track shape of the one cross section of the case 310 to accommodate the case 310 of the electronic pen 300 whose one cross-section has the track shape. A length d4 of a minor axis of the accommodating hole 305 may be greater than the length d2 of the minor axis of the one cross section of the case 310 to accommodate the electronic pen 300. Since the lateral side 213 and 223 of the housing 200 include the accommodating hole 305, the length d3 corresponding to the thickness of the lateral side 213 and 223 may be greater than the length d4 of the minor axis of the accommodating hole 305. Since the length d4 of the minor axis of the accommodating hole 305 is greater than the length d2 of the minor axis of the one cross section of the case 310, the length d3 corresponding to the thickness of the lateral side 213 and 223 may be greater than the length d2 of the minor axis of the one cross section of the case 310.

According to yet another embodiment, the pen tip 320 may be disposed at one end 311 of the case 310. The pen tip 320 may protruded from the one end 311 to the outside of the case 310. For example, the one end 311 of the case 310 may include a case hole. The pen tip 320 may be protrude from the case hole to the outside of the electronic pen 300 by penetrating the case hole. According to an embodiment, the pen tip 320 may be seated on a periphery of the case hole.

According to yet another embodiment, the rod 330 may extend from the pen tip 320 into the inside of the electronic pen 300. For example, the rod 330 may be disposed inside the case 310. The rod 330 may extend in a direction opposite to a direction in which the pen tip 320 is protruded outward. The rod 330 may be connected to the pen tip 320 in the case 310. According to yet another embodiment, the rod 330 may penetrate the case hole disposed at the one end 311 of the case 310. The rod 330 may be connected to the pen tip 320 through the case hole.

According to yet another embodiment, the core 340 may be disposed inside the case 310. The core 340 may include a through hole 350 accommodating at least a portion of the rod 330. For example, the rod 330 may penetrate the core 340 disposed inside the case 310 by extending from the pen tip 320 to the inside of the case 310. The through hole 350 of the core 340 may accommodate the rod 330. As the through hole 350 accommodates the rod 330, the core 340 may support the rod 330.

According to yet another embodiment, the core 340 may have the track shape corresponding to the one cross section of the case 310 to be disposed inside the case 310. For example, the core 340 may include parallel planes 343 and 345, facing each of the flat regions 311*a* and 312*a* of the case 310. The core 340 may include curved surfaces 344 and 346 extending from the planes 343 and 345 and facing each of the curved regions 311*b* and 312*b* of the case 310. Each of the curved surfaces 344 and 346 may have a shape corresponding to each of the curved regions 311*b* and 312*b*. Since each of the planes 343 and 345 of the core 340 corresponds to a shape of each of the flat regions 311*a* and 312*a* of the case 310, and the curved surfaces 344 and 346 of the core 340 correspond to a shape of each of the curved regions 311*b* and 312*b* of the case 310, a shape of one cross section of the core 340 may have the track shape corresponding to a shape of the one cross section of the case 310. For example, a length d5 of the major axis of the one cross section of the core 340 may be greater than a length d6 of the minor axis of the one cross section of the core 340. Since the one cross section of the core 340 has the track shape having the length d6 of the minor axis, the minor axis of the one cross section of the case 310 may have the length d2 smaller than the length d3 corresponding to the thickness of the lateral side 213 and 223 of the housing 200. According to yet another embodiment, the length d5 of the major axis of the one cross section of the core 340 may be positioned in a range of 2 mm or more and 3 mm or less. The length d6 of the minor axis of the one cross section of the core 340 may be positioned in a range of 1 mm or more and 2 mm or less.

According to yet another embodiment, the conductive coil 360 may surround at least a portion of the core 340. The conductive coil 360 may allow an induced current to flow in response to a change in an external magnetic field. The coil 360 may function as an inductor that generates an induced electromotive force with respect to the induced current. The core 340 surrounded by the conductive coil 360 may be magnetized with respect to the external magnetic field by having a designated range of magnetic permeability. The conductive coil 360 may increase an inductance L of the conductive coil 360 by surrounding the core 340 having the magnetic permeability in the designated range. According to yet another embodiment, the conductive coil 360 may increase the inductance L of the conductive coil 360 by increasing the number of turns in the conductive coil 360 wound around the core 340.

According to the above-described embodiment, the electronic device 101 may provide enhanced user experience to a user of the electronic device 101 by including the electronic pen 300 detachable from the housing 200. The electronic pen 300 may be configured so that the electronic pen 300 may be accommodated in the housing 200 by including the core 340 having the length d6 of the minor axis of the one cross section smaller than the length d5 of the major axis. The core 340 may increase the inductance L of the conductive coil 360 surrounding the core 340 by having the magnetic permeability in the designated range.

Figure 4:
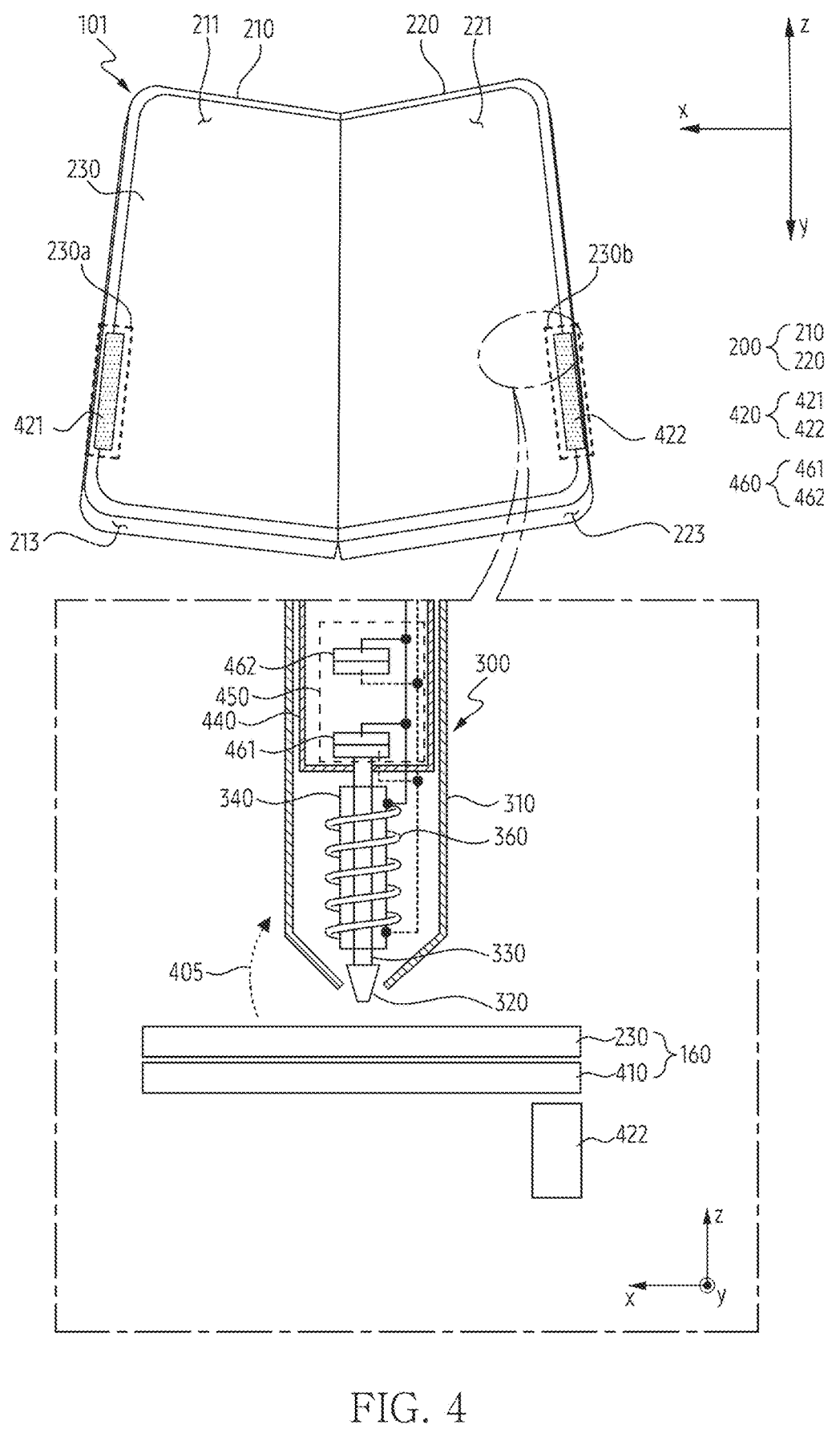

FIG. 4 illustrates an operation of an electronic pen according to an embodiment of the disclosure.

Referring to FIG. 4, the electronic device 101 may include a housing 200, a hinge structure (e.g., the hinge structure 260 of FIG. 2C), a processor (e.g., the processor 120 of FIG. 1), a display module 160, and an electronic pen 300 detachable from the housing 200. The electronic pen 300 may include a case 310, a pen tip 320, a rod 330, a core 340, a conductive coil 360, and a printed circuit board 440.

According to an embodiment, the housing 200 may include a first housing 210 and a second housing 220. The first housing 210 may include a first surface 211 and a second surface (e.g., the second surface 212 of FIG. 2A) opposite the first surface 211. The second housing 220 may include a third surface 221 and a fourth surface (e.g., the fourth surface 222 of FIG. 2A) opposite the third surface 221. A first lateral side 213 of the first housing 210 may surround at least a portion of the first surface 211 and the second surface 212. The second lateral side 223 of the second housing 220 may surround at least a portion of the third surface 221 and the fourth surface 222. According to another embodiment, an accommodating hole 305 for accommodating the electronic pen 300 may be disposed on at least a portion of the second lateral side 223 of the second housing 220.

According to yet another embodiment, the hinge structure (e.g., the hinge structure 260 of FIG. 2C) may be changed to a folded state in which the first surface 211 of the first housing 210 and the third surface 221 of the second housing 220 face each other, or an unfolded state in which a direction in which the first surface 211 faces and a direction in which the third surface 221 faces are the same, by rotatably coupling the first housing 210 and the second housing 220. According to yet another embodiment, in the folded state, at least a portion of the first lateral side 213 of the first housing 210 may contact at least a portion of the second lateral side 223 of the second housing 220.

According to yet another embodiment, the display module 160 of the electronic device 101 may include an electromagnetic induction panel (e.g., digitizer) 410 electrically interacting with the electronic pen 300. A processor 120 of the electronic device 101 may be configured to obtain input information from an electronic interaction between the electronic pen 300 and the electromagnetic induction panel 410. For example, the electromagnetic induction panel 410 may generate a magnetic field of designated intensity by an alternating current flowing through the electromagnetic induction panel 410. As the electronic pen 300 becomes close to the electromagnetic induction panel 410, an induced current may flow through the conductive coil 360 disposed in the electronic pen 300 by the magnetic field. The electronic pen 300 may detect the induced current flowing through the conductive coil 360 and transmit an electromagnetic wave signal 405 to the electromagnetic induction panel 410. The electromagnetic induction panel 410 may detect a position and intensity of the electromagnetic wave signal 405 received from the electronic pen 300 and transmit information related to the electromagnetic wave signal 405 to the processor 120 of the electronic device 101. The processor 120 may display the information according to an operation of the electronic pen 300 on the display module 160 of the electronic device 101, by receiving the information related to the electromagnetic wave signal 405 from the electromagnetic induction panel 410.

According to yet another embodiment, the electronic device 101 may further include a magnet 420 disposed between the display module 160 and the housing 200. The magnet 420 may face the lateral side 213 and 223 of the housing 200. For example, the magnet 420 may be disposed between the display module 160 and the second surface 212 of the first housing 210 and may face the first lateral side 213 of the first housing 210. For example, the magnet 420 may be disposed between the display module 160 and the fourth surface 222 of the second housing 220 and may face the second lateral side 223 of the second housing 220.

According to yet another embodiment, the display module 160 may include a flexible display panel 230. The flexible display panel 230 may be disposed, across the hinge structure 260, on the first surface 211 of the first housing 210 and the third surface 221 of the second housing 220. The electronic device 101 may further include a first magnet 421 disposed between the first surface 211 and the second surface 212, and a second magnet 422 disposed between the third surface 221 and the fourth surface 222. The second magnet 422 may face the first magnet 421 in the folded state. The first magnet 421 may be configured to maintain the folded state by having different polarity from the second magnet 422. For example, since the first surface 211 and the third surface 221 face each other in the folded state, the flexible display panel 230 disposed on the first surface 211 may face the flexible display panel 230 disposed on the second surface 212. The first magnet 421 may be disposed between the first surface 211 and the second surface 212 of the first housing 210, and may overlap a first overlapping region 230*a* of the flexible display panel 230 disposed on the first surface 211 when the flexible display panel 230 is viewed from above. The second magnet 422 may be disposed between the third surface 221 and the fourth surface 222 of the second housing 220, and may overlap a second overlapping region 230*b* of the flexible display panel 230 disposed on the third surface 221 when the flexible display panel 230 is viewed from above. In the folded state, the first overlapping region 230*a* may contact the second overlapping region 230*b*. In the folded state, since the first overlapping region 230*a* faces the second overlapping region 230*b*, the first magnet 421 may face the second magnet 422. By having different polarity from the second magnet 422, the first magnet 421 may maintain a state in which the first overlapping region 230*a* and the second overlapping region 230*b* contact each other in a folded state.

According to yet another embodiment, the display module 160 may include the electromagnetic induction panel 410 and the flexible display panel 230 disposed on the electromagnetic induction panel 410. When the flexible display panel 230 is viewed from above, the overlapping regions 230*a* and 230*b* overlapping the magnets 421 and 422, respectively, may have intensity of the magnetic field stronger than a rest region of the flexible display panel 230 except for the overlapping regions 230*a* and 230*b* by the magnets 421 and 422. For example, the rest region of the flexible display panel 230 except for the overlapping regions 230*a* and 230*b* may have intensity of the magnetic field in a designated range by the alternating current flowing through the electromagnetic induction panel 410. The overlapping regions 230*a* and 230*b* of the flexible display panel 230 may have the intensity of the magnetic field greater than the intensity of the magnetic field in the designated range by the magnets 421 and 422.

According to yet another embodiment, the electronic pen 300 may further include a resonance circuit 450 disposed on the printed circuit board 440. For example, the printed circuit board 440 may be disposed in the case 310 of the electronic pen 300 and extended in a longitudinal direction of the case 310. The resonance circuit 450 may be disposed on one surface of the printed circuit board 440 along the extending direction of the printed circuit board 440. As the electronic pen 300 becomes close to the display module 160 of the electronic device 101, the resonance circuit 450 may detect the induced current flowing through the conductive coil 360 of the electronic pen 300 by the electromagnetic induction panel 410 included in the display module 160. The resonance circuit 450 may generate the electromagnetic wave signal 405 that the electromagnetic induction panel 410 may detect by detecting the induced current.

According to yet another embodiment, the resonance circuit 450 may include at least one capacitor 460. The at least one capacitor 460 may include a first capacitor 461 and a second capacitor 462. The first capacitor 461 may be configured to change capacitance C of the resonance circuit 450, when the rod 330 moves in a first direction (e.g., +z direction) as the pen tip 320 of the electronic pen 300 is pressed or when the rod 330 moves in a second direction (e.g., −z direction) opposite to the first direction as the pressure is released. For example, the first capacitor 461 may be a variable capacitor. In the first capacitor 461, capacitance C1 of the first capacitor 461 may change when the rod 330 moves in the first direction (e.g., +z direction) as the pen tip 320 the electronic pen 300 is pressed by the flexible display panel 230. The processor 120 of the electronic device 101 may identify a change in resonance frequency of the electromagnetic wave signal 405 according to a change in the capacitance C1 of the first capacitor 461 through the electromagnetic induction panel 410 of the electronic device 101. In the first capacitor 461, the capacitance C1 of the first capacitor 461 may change when the rod 330 moves in the second direction (e.g., −z direction) opposite to the first direction as the pressure is released by the flexible display panel 230. The first capacitor 461 may change the capacitance C1 of the first capacitor 461 according to pressure intensity through movement of the rod 330 according to the pressure intensity of the pen tip 320. Unlike the first capacitor 461, the second capacitor 462 may maintain capacitance C2 of the second capacitor 462 regardless of the pressure of the pen tip 320. The first capacitor 461 may change the capacitance C of the resonance circuit 450 including the first capacitor 461 by changing the capacitance C1 of the first capacitor 461.

Although it is described that the resonance circuit 450 includes the first capacitor 461 and the second capacitor 462, it is not limited thereto. The resonance circuit 450 may include a plurality of variable capacitors and a plurality of capacitors to which the capacitance is fixed. By including the plurality of variable capacitors of which the capacitance changes according to pen pressure of the electronic pen 300, the resonance circuit 450 may be configured to change the capacitance C of the resonance circuit 450 according to the pen pressure.

According to yet another embodiment, the pen tip 320 and the rod 330 may include a conductive material. For example, the pen tip 320 and the rod 330 may include conductive silicon. Since the pen tip 320 and the rod 330 include the conductive material, the electronic pen 300 may electrically interact with the electromagnetic induction panel 410 included in the display module 160.

The electronic device 101 according to the above-described embodiment may maintain the folded state by including magnets 421 and 422. The electronic device 101 may electrically interact with the electronic pen 300 by including the electromagnetic induction panel 410 in the display module 160. The electronic pen 300 may detect the pen pressure of the electronic pen 300 and electrically interact with the electromagnetic induction panel 410 by including the resonance circuit 450 including the first capacitor 461 in the case 310.

Figure 5:
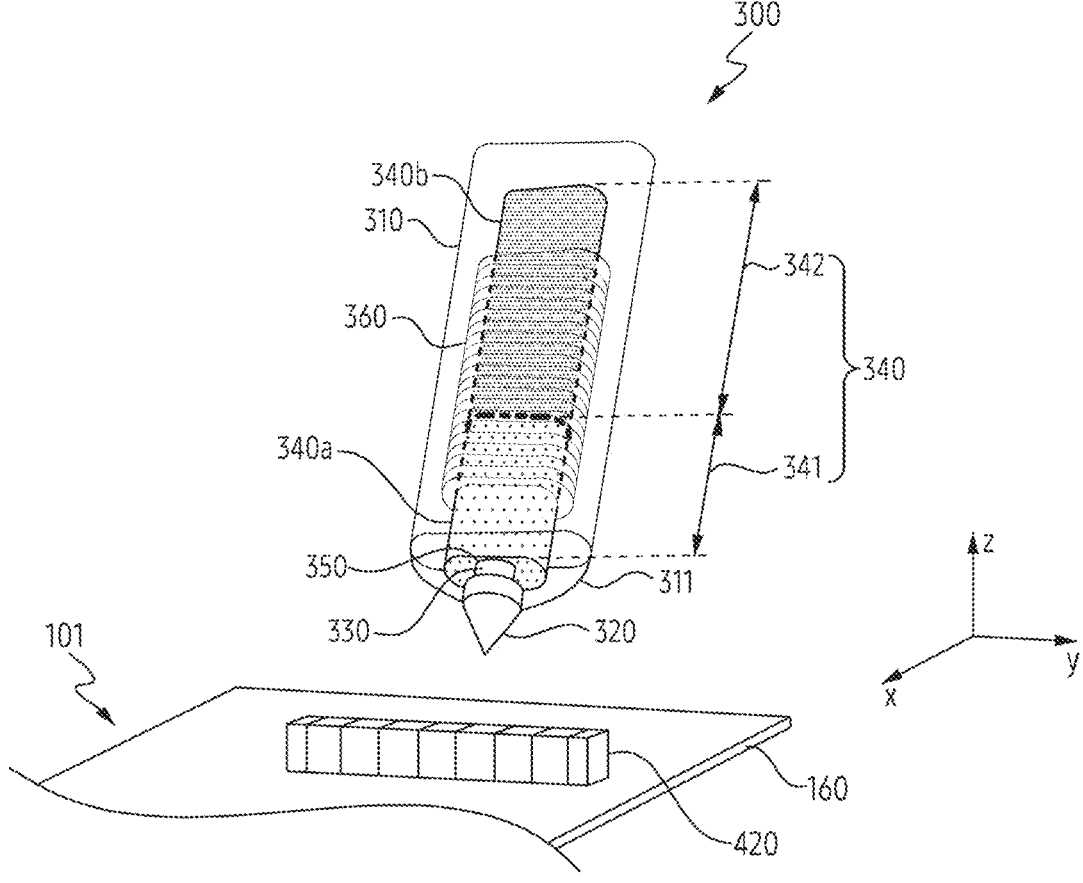
FIG. 5 illustrates a core structure of an electronic pen according to an embodiment of the disclosure.

FIG. 5 illustrates a core structure of an electronic pen according to an embodiment of the disclosure.

Referring to FIG. 5, the electronic device 101 may include a display module 160 and a magnet 420. The electronic pen 300 may include a case 310, a pen tip 320, a rod 330, a core 340, and a conductive coil 360. The core 340 may include a through hole 350 accommodating at least a portion of the rod 330.

According to an embodiment, the core 340 may further include a first portion 341 facing one end 311 of the case 310 including a first material m1, and a second portion 342 contacting the first portion 341 including a second material m2. The through hole 350 of the core 340 may penetrate the first portion 341 and the second portion 342. For example, the first portion 341 of the core 340 may extend toward the one end 311 of the case 310 on which the pen tip 320 is disposed. The second portion 342 of the core 340 may extend from one surface of the first portion 341 toward an inside of the case 310 toward the inside of the case 310. The through hole 350 may penetrate the first portion 341 and the second portion 342. Since the rod 330 extending from the pen tip 320 toward the inside of the case 310 penetrates the through hole 350, the rod 330 may penetrate the first portion 341 and the second portion 342.

According to another embodiment, as the electronic pen 300 becomes close to the display module 160, the first portion 341 of the core 340 may be a portion in which magnetic interference generated by the magnet 420 is strong. The second portion 342 contacting the first portion 341 may be a portion in which the magnetic interference due to the magnetic field is weaker than that of the first portion 341. Since the first portion 341 includes the first material m1 and the second portion 342 includes the second material m2, the core 340 may have different electromagnetic property in the first portion 341 and the second portion 342, respectively.

According to yet another embodiment, the conductive coil 360 may surround at least a portion of the second portion 342. According to yet another embodiment, the conductive coil 360 may further surround at least a portion of the first portion 341. According to yet another embodiment, a length of the first portion 341 may be positioned in a range of 1 mm or more and 2 mm or less.

According to yet another embodiment, a magnetic flux density b1 of the first material m1 disposed in the first portion 341 may be greater than a magnetic flux density b2 of the second material m2 disposed in the second portion 342. When the display module 160 is viewed from above, the electronic pen 300 may become close to overlapping regions (e.g., overlapping regions 230a and 230b of FIG. 4) in which the display module 160 overlaps the magnet 420. Since the magnetic flux density b1 of the first material m1 of the first portion 341 of which the magnetic interference is strong due to a magnetic field of the magnet 420 is greater than the magnetic flux density b2 of the second material m2 of the second portion 342 of which magnetic interference is weaker than that of the first portion 341, the core 340 may reduce a decrease in an inductance L of the conductive coil 360 surrounding the core 340 due to magnetic saturation of the core 340.

According to yet another embodiment, magnetic permeability p1 of the first material m1 disposed in the first portion 341 may be lower than magnetic permeability p2 of the second material m2 disposed in the second portion 342. When the display module 160 is viewed from above, the electronic pen 300 may become close to a rest region of the display module 160 except for the overlapping regions 230a and 230b in which the display module 160 overlaps the magnet 420. The display module 160 may include an electromagnetic induction panel (e.g., the electromagnetic induction panel 410 of FIG. 4) through which an alternating current flows. The electromagnetic induction panel 410 may generate a magnetic field having intensity in a designated range generated by the alternating current. Since the magnetic permeability p2 of the second material m2 disposed in the second portion 342 of the core 340 is higher than the magnetic permeability p1 of the first material m1 disposed in the first portion 341 contacting the second portion 342 facing the display module 160, a decrease of the inductance L of the conductive coil 360 surrounding the core 340 due to a decrease in the magnetic permeability of the core 340 may be reduced.

According to yet another embodiment, the first material m1 disposed in the first portion 341 may include metal powders. The second material m2 disposed in the second portion 342 may include ferrite. For example, the magnetic flux density b1 of the first material m1 disposed in the first portion 341 including the metal powders is greater than the magnetic flux density b2 of the second material m2 disposed in the second portion 342 including ferrite. For example, the magnetic permeability p2 of the second material m2 disposed in the second portion 342 including ferrite may be greater than the magnetic permeability p1 of the first material m1 disposed in the first portion 341 including the metal powders.

According to yet another embodiment, the first portion 341 of the core 340 may include a first region 340a protruded in the second direction (e.g., −z direction) opposite to the first direction (e.g., +z direction) in which the pen tip 320 is pressed with respect to the conductive coil 360. The second portion 342 of the core 340 may include a second region 340b protruded in the first direction with respect to the conductive coil 360. The core 340 may increase an electromagnetic interaction between the magnetic field generated from the display module 160 and both the core 340 and the conductive coil 360, by including the first region 340a and the second region 340b protruded with respect to the conductive coil 360. According to yet another embodiment, a length of the first region 340a and a length of the second region 340b may be in the range of 2 mm or more and 3 mm or less, respectively.

According to the above-described embodiment, by varying a material of the first portion 341 having strong magnetic interference of the magnetic field generated from the electronic device 101 and a material of the second portion 342 contacting the first portion 341 and having weaker magnetic interference of the magnetic field than the first portion 341, the core 340 of the electronic pen 300 may reduce the decrease of the inductance L of the conductive coil 360 according to the intensity of the magnetic field.

Figure 6:
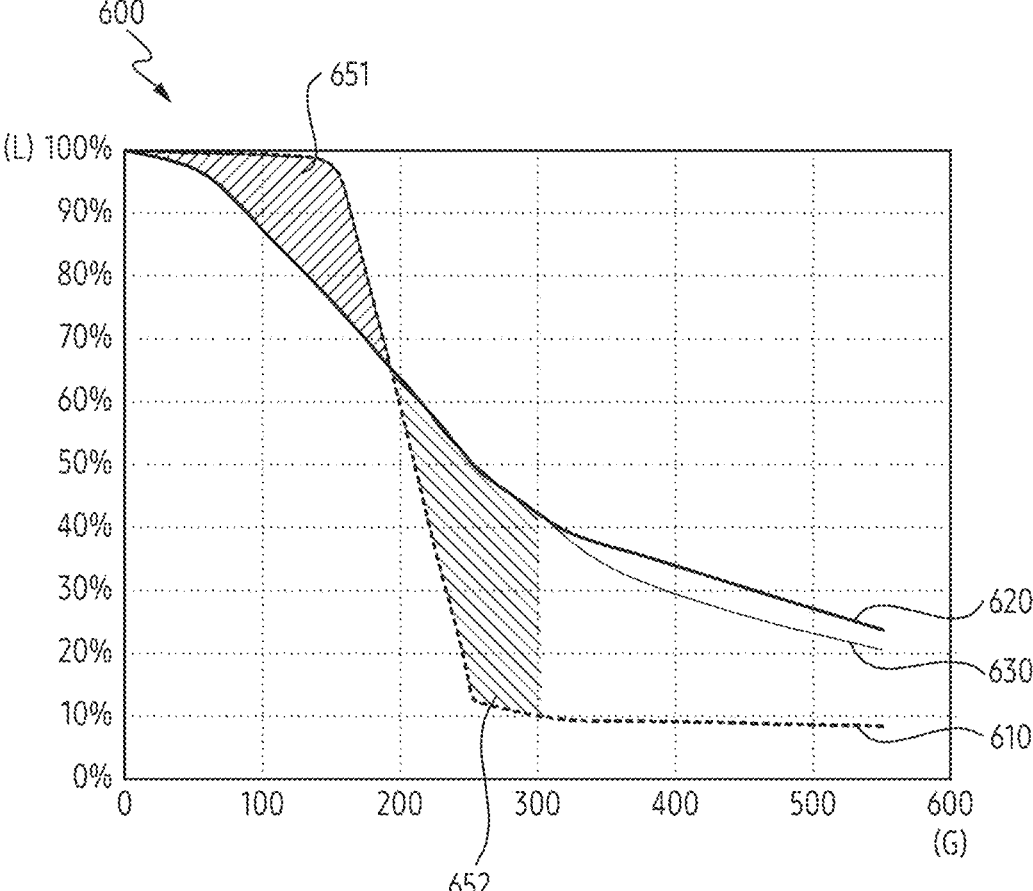
FIG. 6 is a graph illustrating a relationship between inductance and intensity of a magnetic field according to a material of a core structure according to an embodiment of the disclosure.

FIG. 6 is a graph illustrating a relationship between inductance and intensity of a magnetic field according to a material of a core structure according to an embodiment of the disclosure.

Referring to FIG. 6, a horizontal axis of a graph 600 indicates intensity of a magnetic field around a conductive coil (e.g., the conductive coil 360 of FIG. 3) of an electronic pen (e.g., the electronic pen 300 of FIG. 3). A vertical axis of the graph 600 indicates an inductance L of the conductive coil 360.

Referring to the graph 600, as the intensity of the magnetic field around the conductive coil 360 increases, the inductance L of the conductive coil 360 may decrease. For example, the inductance L of the conductive coil 360 may decrease due to magnetic saturation of a core 340 as the magnetic field around the conductive coil 360 is greater than a magnetic flux density of the core 340 surrounded by the conductive coil 360.

A graph 610 indicates the inductance L of the conductive coil 360 according to the intensity of the magnetic field around the conductive coil 360 in case that the material of a core (e.g., the core 340 of FIG. 3) surrounded by the conductive coil 360 is ferrite. A graph 620 indicates the inductance L of the conductive coil 360 according to the intensity of the magnetic field around the conductive coil 360, in case that the material of the core 340 surrounded by the conductive coil 360 is metal powders.

Referring to the graph 610, the core 340 of a ferrite material may reduce a decrease in the inductance L of the conductive coil 360 surrounding the core 340 in case that the intensity of the magnetic field around the conductive coil 360 has a designated range (e.g., an intensity range of the magnetic field of 100 G or more and 150 G or less). The core 340 of the ferrite material may reduce the inductance L of the conductive coil 360 surrounding the core 340, in case that the intensity of the magnetic field around the conductive coil 360 has intensity greater than or equal to a designated strength (e.g., intensity of 150 G or more and 250 G or less).

Referring to the graph 620, the core 340 of metal powders material may reduce the decrease in the inductance L of the conductive coil 360 surrounding the core 340 than the core 340 of the ferrite material in an intensity range of the magnetic field in a designated range, in case that the intensity of the magnetic field around the conductive coil 360 has the designated range (e.g., an intensity range of the magnetic field of 200 G or more and 300 G or less). The core 340 of the metal powders material may reduce the inductance L of the conductive coil 360 surrounding the core 340 than the core 340 of the ferrite material, in case that intensity of the magnetic field around the conductive coil 360 has the intensity less than or equal to a designated intensity (e.g., the intensity of 0 G or more and 200 G or less).

Graph 630 indicates the inductance L of the conductive coil 360 according to the intensity of the magnetic field around the conductive coil 360, in case that a material of a first portion (e.g., the first portion 341 of FIG. 5) of the core 340 surrounded by the conductive coil 360 is the metal powders, and a material of a second portion (e.g., the second portion 342 of FIG. 5) of the core 340 is the ferrite. Referring to the graph 630, the core 340 including the first portion 341 and the second portion 342 may reduce the decrease in the inductance L of the conductive coil 360 due to the core 340 of the metal powders in a first compensation region 651. The core 340 including the first portion 341 and the second portion 342 may reduce the decrease in the inductance L of the conductive coil 360 due to the core 340 of the ferrite in a second compensation region 652.

According to the above-described embodiment, by varying a material of the first portion 341 having strong magnetic interference of the magnetic field generated from the electronic device 101 (e.g., the electronic device 101 of FIG. 1)

and a material of the second portion 342 contacting the first portion 341 and having weaker magnetic interference of the magnetic field than the first portion 341, the core 340 of the electronic pen 300 may reduce the decrease of the inductance L of the conductive coil 360 of the electronic pen 300 according to the intensity of the magnetic field.

According to the above-described embodiment, an electronic device (e.g., the electronic device 101 of FIG. 1) may comprise a housing (e.g., the housing 200 of FIG. 2A, the first housing 210, and the second housing 220), an electronic pen (e.g., the electronic pen 300 of FIG. 3) detachable from the housing. The electronic pen may include a case (e.g., the case 310 of FIG. 3), a pen tip (e.g., the pen tip 320 of FIG. 3), disposed at one end (e.g., the one end 311 of FIG. 3) of the case, protruded from the one end to an outside of the case, a rod (e.g., the rod 330 of FIG. 3) extending from the pen tip into an inside, a core (e.g., the core 340 of FIG. 3) including a first portion (e.g., the first portion 341 of FIG. 5), facing the one end of the case, including a first material (e.g., the m1 of FIG. 5), a second portion (e.g., the second portion 342 of FIG. 5), contacting the first portion, including a second material (e.g., the m2 of FIG. 5), and a through hole (e.g., the through hole 350 of FIG. 3), penetrating the first and second portions, accommodating at least a portion of the rod, and a conductive coil (e.g., the conductive coil 360 of FIG. 3) surrounding at least a portion of the second portion. A magnetic flux density (e.g., the p1 of FIG. 5) of the first material may be greater than a magnetic flux density (e.g., the p2 of FIG. 5) of the second material. According to the above-mentioned embodiment, the electronic device may provide a various user experience to a user of the electronic device, by including the electronic pen that electromagnetically interacts with the electronic device. The electronic pen may increase an inductance of the conductive coil by including the core. Since a magnetic flux density of the first portion of which a magnetic interference of a magnetic field generated from the electronic device is strong is greater than a magnetic flux density of the second of the second portion of which magnetic interference of the magnetic field is weaker than the first portion, the core may reduce a decrease in the inductance of the conductive coil due to magnetic saturation of the core. The above-mentioned embodiment may have a various effect including the above-mentioned effect.

According to an embodiment, the electronic device may further comprise a display (e.g., the display module 160 of FIG. 1, and the display panel 230 and the flexible display panel 235 of FIG. 2A) including an electromagnetic induction panel (e.g., the electromagnetic induction panel 410 of FIG. 4) electrically interacting with the electronic pen, and a processor (e.g., the processor 120 of FIG. 1) configured to obtain input information from an electronic interaction between the electronic pen and the electromagnetic induction panel. According to the above-mentioned embodiment, the electronic device may electrically interact with the electronic pen by including the electromagnetic induction panel and the processor. The above-mentioned embodiment may have a various effect including the above-mentioned effect.

The electronic device according to another embodiment may further comprise a magnet (e.g., the magnet 420, the first magnet 421, and the second magnet 422 of FIG. 4), disposed between the display and the housing, facing a lateral side (e.g., the first lateral side 213 and the second lateral side 223 of FIG. 2A) of the housing. According to the above-mentioned embodiment, the electronic device may provide a various user experience for the housing to the user of the electronic device by including the magnet. The above-mentioned embodiment may have a various effect including the above-mentioned effect.

According to yet another embodiment, the case may comprise a flat region (e.g., the flat region 310a, the first flat region 311a, and the second flat region 312a of FIG. 3) extending in a longitudinal direction of the electronic pen, and a curved region (e.g., the curved region 310b, the first curved region 311b, and a second curved region 312b of FIG. 3), extending from the flat region, surrounding the inside. According to the above-mentioned embodiment, by including the flat region, the case may provide the electronic pen with a thickness smaller than a thickness of the housing so that the electronic pen may be accommodated in the housing of the electronic device. The electronic pen may provide a comfortable grip to the user of the electronic pen, by including the curved region extending from the flat region. The above-mentioned embodiment may have a various effect including the above-mentioned effect.

According to yet another embodiment, one cross section of the case may have a track shape of which a length (e.g., the d1 of FIG. 3) of a major axis is longer than a length (e.g., the d2 of FIG. 3) of a minor axis. According to the above-mentioned embodiment, the case may provide the electronic pen with the thickness smaller than the thickness of the housing so that the electronic pen may be accommodated in the housing of the electronic device, by having the track shape in which the minor axis of the one cross section is shorter than the major axis. The above-mentioned embodiment may have a various effect including the above-mentioned effect.

According to yet another embodiment, the length of the minor axis of the one cross section may be smaller than a length (e.g., d3 of FIG. 3) corresponding to a thickness of a lateral side of the housing. According to the above-mentioned embodiment, the case may provide the electronic pen with the thickness smaller than the thickness of the housing so that the electronic pen may be accommodated in the housing of the electronic device, by having the track shape in which the minor axis of the one cross section is shorter than the major axis. The above-mentioned embodiment may have a various effect including the above-mentioned effect.

According to yet another embodiment, the core may have a track shape corresponding to the one cross section of the case to be disposed within the case. According to the above-mentioned embodiment, the core may provide the electronic pen with the thickness smaller than the thickness of the housing so that the electronic pen may be accommodated in the housing of the electronic device, by having the track shape in which the minor axis is shorter than the major axis. The above-mentioned embodiment may have a various effect including the above-mentioned effect.

According to yet another embodiment, the housing (e.g., the housing 200 of FIG. 2A) may include a first housing (e.g., the first housing 210 of FIG. 2A) including a first surface (e.g., the first surface 211 of FIG. 2A) and a second surface (e.g., the second surface 212 of FIG. 2A) opposite to the first surface, and a second housing (e.g., the second housing 220 of FIG. 2A) including a third surface (e.g., the third surface 221 of FIG. 2A) and a fourth surface (e.g., the fourth surface 222 of FIG. 2A) opposite to the third surface. The electronic device may further comprise a hinge structure (e.g., the hinge structure 260 of FIG. 2C) capable of changing into a folded state in which the first surface and the third surface are facing each other or an unfolded state in which a direction toward which the first surface faces and a direction toward which the third surface faces are the same, by rotatably coupling the first housing and the second housing, and a flexible display (e.g., the flexible display panel 230 of FIG. 2A), across the hinge structure, disposed on the first surface and the third surface. According to the above-mentioned embodiment, the electronic device may provide a various user experience to the user of the electronic device, by being configured to be changeable from the folded state to the unfolded state or from the unfolded state to the folded state, including the first housing, the second housing, the hinge structure, and the flexible display. The above-mentioned embodiment may have a various effect including the above-mentioned effect.

According to yet another embodiment, the electronic device may further comprise a first magnet (e.g., the first magnet 421 of FIG. 4) disposed between the first surface and the second surface, and a second magnet (e.g., the second magnet 422 of FIG. 4), disposed between the third surface and the fourth surface, facing the first magnet in the folded state. The first magnet may be configured to maintain the folded state by having different polarity from the second magnet. According to the above-mentioned embodiment, the electronic device may maintain the folded state of the electronic device by including the first magnet and the second magnet. The above-mentioned embodiment may have a various effect including the above-mentioned effect.

According to yet another embodiment, the electronic pen may further include a printed circuit board (e.g., the printed circuit board 440 of FIG. 4), and a resonance circuit (e.g., the resonant circuit 450 of FIG. 4), disposed on the printed circuit board, including a variable capacitor (e.g., the first capacitor 461 of FIG. 4). The variable capacitor may be configured to change capacitance (e.g., the C of FIG. 4) of the resonance circuit when the rod moves in a first direction as the pen tip is pressed or when the rod moves in a second direction opposite to the first direction as the pressure is released. According to the above-mentioned embodiment, the electronic pen may electromagnetically interact with the electromagnetic induction panel of the electronic device by including the resonance circuit. By including the variable capacitor, the resonance circuit may be configured to change the capacitance of the resonance circuit according to pen pressure of the electronic pen. The above-mentioned embodiment may have a various effect including the above-mentioned effect.

According to yet another embodiment, the first portion of the core may include a first region (e.g., the first region 340a of FIG. 5) protruded in the second direction with respect to the conductive coil, and the second portion of the core may include a second region (e.g., the second region 340b of FIG. 5) protruded in the first direction with respect to the conductive coil. According to the above-mentioned embodiment, the core may electromagnetically interact with the electromagnetic induction panel of the electronic device, by including the first region, and the second region. The above-mentioned embodiment may have a various effect including the above-mentioned effect.

According to yet another embodiment, the pen tip and the rod may comprise a conductive material. According to the above-mentioned embodiment, the electronic pen may electrically interact with a display module of the electronic device contacting the pen tip, by including the pen tip and the rod including a conductive material. The above-mentioned embodiment may have a various effect including the above-mentioned effect.

According to yet another embodiment, the first material may comprise metal powders, and the second material may comprise ferrite. According to the above-mentioned embodiment, by varying a material of a first material included in a first portion having strong magnetic interference of a magnetic field generated from the electronic device, and a material of a second material included in a second portion having weaker magnetic interference of the magnetic field than the first portion, the above-mentioned embodiment may reduce a decrease of an inductance of a conductive coil of the electronic pen according to intensity of the magnetic field. There may be a various effect including the above-mentioned effect.

According to yet another embodiment, magnetic permeability (e.g., the p1 of FIG. 5) of the first material may be smaller than magnetic permeability (e.g., the p2 of FIG. 5) of the second material. According to the above-mentioned embodiment, since magnetic permeability of the first material disposed in the second portion of a core is greater than magnetic permeability of the first material disposed in the first portion, a decrease in an inductance of a conductive coil surrounding the core due to a decrease in magnetic permeability of the core may be reduced. The above-mentioned embodiment may have a various effect including the above-mentioned effect.

According to yet another embodiment, the conductive coil may further surround at least a portion of the first portion. According to the above-mentioned embodiment, since the conductive coil surrounds at least a portion of the first portion, a decrease in an inductance of the conductive coil according to a change in intensity of a magnetic field of the electronic device may be reduced. The above-mentioned embodiment may have a various effect including the above-mentioned effect.

According to yet another embodiment, an electronic pen may comprise a case, a pen tip, disposed at one end of the case, protruded from the one end to an outside of the case, a rod extending from the pen tip into an inside, a core including a first portion, facing the one end, including a first material, a second portion, contacting the first portion, including a second material, and a through hole, penetrating the first and second portions, accommodating at least a portion of the rod, and a conductive coil surrounding at least a portion of the second portion. A magnetic flux density of the first material may be greater than a magnetic flux density of the second material. According to the above-mentioned embodiment, the electronic pen may increase an inductance of the conductive coil by including a core. Since a magnetic flux density of the first portion of which a magnetic interference of a magnetic field generated from the electronic device is strong is greater than a magnetic flux density of the second of the second portion of which magnetic interference of the magnetic field is weaker than the first portion, the core may reduce a decrease in an inductance of the conductive coil due to magnetic saturation of the core. The above-mentioned embodiment may have a various effect including the above-mentioned effect.

According to yet another embodiment, the electronic pen may further comprise a printed circuit board, and a resonance circuit, disposed on the printed circuit board, including a variable capacitor. The variable capacitor may be configured to change capacitance of the resonance circuit when the rod moves in a first direction as the pen tip is pressed or when the rod moves in a second direction opposite to the first direction as the pressure is released. According to the above-mentioned embodiment, the electronic pen may electromagnetically interact with an electromagnetic induction panel of the electronic device by including the resonance circuit. By including the variable capacitor, the resonance circuit may be configured to change the capacitance of the resonance circuit according to pen pressure of the electronic pen. The above-mentioned embodiment may have a various effect including the above-mentioned effect.

According to yet another embodiment, the first portion of the core may include a first region protruded in the second direction with respect to the conductive coil, and the second portion of the core may include a second region protruded in the first direction with respect to the conductive coil. According to the above-mentioned embodiment, the core may electromagnetically interact with the electromagnetic induction panel of the electronic device, by including the first region, and the second region. The above-mentioned embodiment may have a various effect including the above-mentioned effect.

According to yet another embodiment, the pen tip and the rod may comprise a conductive material. According to the above-mentioned embodiment, the electronic pen may electrically interact with a display module of the electronic device contacting the pen tip, by including the pen tip and the rod including a conductive material. The above-mentioned embodiment may have a various effect including the above-mentioned effect.

According to yet another embodiment, the first material may include metal powders, and the second material may include ferrite. According to the above-mentioned embodiment, by varying a material of a first material included in a first portion having strong magnetic interference of a magnetic field generated from the electronic device, and a material of a second material included in a second portion having weaker magnetic interference of the magnetic field than the first portion, the above-mentioned embodiment may reduce a decrease of an inductance of a conductive coil of the electronic pen according to intensity of the magnetic field. There may be a various effect including the above-mentioned effect.

According to yet another embodiment, magnetic permeability of the first material may be smaller than magnetic permeability of the second material. According to the above-mentioned embodiment, since magnetic permeability of the first material disposed in the second portion of a core is greater than magnetic permeability of the first material disposed in the first portion, a decrease in an inductance of a conductive coil surrounding the core due to a decrease in magnetic permeability of the core may be reduced. The above-mentioned embodiment may have a various effect including the above-mentioned effect.

According to yet another embodiment, the conductive coil may further surround at least a portion of the first portion. According to the above-mentioned embodiment, since the conductive coil surrounds at least a portion of the first portion, a decrease in an inductance of the conductive coil according to a change in intensity of a magnetic field of the electronic device may be reduced. The above-mentioned embodiment may have a various effect including the above-mentioned effect.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to yet another embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to yet another embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to yet another embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

No claim element is to be construed under the provisions of 35 U.S.C. § 112, sixth paragraph, unless the element is expressly recited using the phrase "means for" or "means."

What is claimed is:

1. An electronic pen comprising:
a pen tip;
a core supporting the pen tip, the core including:
   a first portion comprising a first material, and
   a second portion comprising a second material, wherein the first portion of the core is closer to the pen tip than the second portion of the core; and
a conductive coil winding an exterior of the core,
wherein a saturation flux density of the first material is greater than a saturation flux density of the second material.

2. The electronic pen of claim 1,
wherein magnetic permeability of the first material is smaller than magnetic permeability of the second material.

3. The electronic pen of claim 1,
wherein the first material comprises metal powders, and wherein the second material comprises ferrite.

4. The electronic pen of claim 1, further comprising:
a case defining an exterior of the electronic pen,
wherein the case includes:
   a flat region extending in a longitudinal direction of the electronic pen, and
   a curved region, extending from the flat region, defining an inside of the case together with the flat region.

5. The electronic pen of claim 4, wherein one cross section of the case has a track shape of which a length of a major axis is longer than a length of a minor axis.

6. The electronic pen of claim 5, wherein the length of the minor axis of the one cross section is smaller than a length corresponding to a thickness of a lateral side of an electronic device.

7. The electronic pen of claim 5, wherein the core has a track shape corresponding to the one cross section of the case to be disposed within the case.

8. The electronic pen of claim 1, further comprising:
a case defining an exterior of the electronic pen, and
a rod extending from the pen tip into an inside of the case.

9. The electronic pen of claim 8,
wherein the core defines a through hole, penetrating the first portion of the core, and the second portion of the core, accommodating a portion of the rod.

10. The electronic pen of claim 9, further comprising:
a printed circuit board, and
a resonance circuit, disposed on the printed circuit board, including a variable capacitor,
wherein the variable capacitor is configured to change capacitance of the resonance circuit when the rod moves in a first direction as the pen tip is pressed or when the rod moves in a second direction opposite to the first direction as pressure is released.

11. The electronic pen of claim 10,
wherein the first portion of the core includes a first region protruded in the second direction with respect to the conductive coil, and
wherein the second portion of the core includes a second region protruded in the first direction with respect to the conductive coil.

12. The electronic pen of claim 8, wherein the pen tip and the rod comprise a conductive material.

13. The electronic pen of claim 1,
wherein the electronic pen interacts with an electromagnetic induction panel of a display of an electronic device.

14. The electronic pen of claim 1, wherein the conductive coil further surrounds at least a portion of the first portion.

15. An electronic device comprising:
a housing; and
an electronic pen configured to be detachable from the housing, the electronic pen including:
   a pen tip,
   a core supporting the pen tip, the core including:
      a first portion comprising a first material, and
      a second portion comprising a second material, wherein the first portion of the core is closer to the pen tip than the second portion of the core, and
   a conductive coil surrounding winding an exterior of the core,
   wherein a saturation flux density of the first material is greater than a saturation flux density of the second material.

16. The electronic device of claim 15, further comprising:
a display including an electromagnetic induction panel electrically interacting with the electronic pen; and
a processor configured to obtain input information from an electronic interaction between the electronic pen and the electromagnetic induction panel.

17. The electronic device of claim 16,
further comprising:
a magnet, disposed between the display and the housing, facing a lateral side of the housing.

18. The electronic device of claim 15,
wherein the housing includes:
   a first housing including a first surface and a second surface opposite to the first surface, and
   a second housing including a third surface and a fourth surface opposite to the third surface, and
wherein the electronic device further comprises:

a hinge structure configured to provide a folded state in which the first surface and the third surface are facing each other or an unfolded state in which a direction toward which the first surface faces is corresponding to a direction toward which the third surface faces by rotatably coupling the first housing and the second housing, and a flexible display, across the hinge structure, disposed on the first surface and the third surface.

19. The electronic device of claim 18, further comprising:

a first magnet disposed between the first surface and the second surface; and a second magnet, disposed between the third surface and the fourth surface, facing the first magnet in the folded state, wherein the first magnet is configured to maintain the folded state by having different polarity from the second magnet.

20. A set of electronic devices comprising:

an electronic device including a housing; and an electronic pen configured to be detachable from the housing of the electronic device, the electronic pen including:

a pen tip, a core supporting the pen tip, the core including:

a first portion comprising a first material, and a second portion comprising a second material, wherein the first portion of the core is closer to the pen tip than the second portion of the core, and a conductive coil winding an exterior of the core, and wherein a saturation flux density of the first material is greater than a saturation flux density of the second material.

* * * * *